United States Patent
Arnold et al.

(10) Patent No.: US 7,091,941 B2
(45) Date of Patent: Aug. 15, 2006

(54) COLOR OLED DISPLAY WITH IMPROVED POWER EFFICIENCY

(75) Inventors: Andrew D. Arnold, Hilton, NY (US); Ronald S. Cok, Rochester, NY (US); Michael E. Miller, Rochester, NY (US); Michael J. Murdoch, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 311 days.

(21) Appl. No.: 10/412,534

(22) Filed: Apr. 11, 2003

(65) Prior Publication Data

US 2004/0201558 A1    Oct. 14, 2004

(51) Int. Cl.
*G09G 3/32*    (2006.01)

(52) U.S. Cl. .............................. 345/83; 345/46; 345/48; 345/76; 345/84

(58) Field of Classification Search ................ 345/34, 345/36, 39, 44, 45, 46, 47, 48, 76, 77, 82, 345/84
See application file for complete search history.

(56) References Cited

U.S. PATENT DOCUMENTS

| | | | |
|---|---|---|---|
| 4,609,916 A * | 9/1986 | Bedos et al. ............. | 345/600 |
| 5,526,016 A | 6/1996 | Nakagiri et al. | |
| 5,563,621 A | 10/1996 | Silsby | |
| 5,638,084 A | 6/1997 | Kalt | |
| 5,929,843 A * | 7/1999 | Tanioka ................... | 345/600 |
| 6,366,025 B1 | 4/2002 | Yamada | |
| 6,388,644 B1 | 5/2002 | De Zwart et al. | |
| 2002/0024618 A1 | 2/2002 | Imai | |
| 2002/0186214 A1 | 12/2002 | Siwinski | |

FOREIGN PATENT DOCUMENTS

| | | |
|---|---|---|
| EP | 0 830 032 B1 | 3/2002 |
| EP | 1286569 A1 | 2/2003 |

OTHER PUBLICATIONS

Klompenhouwer et al., Subpixel Image Scaling for Color Matrix Displays, *SID 02 Digest*, 2002, pp. 176-179.

* cited by examiner

*Primary Examiner*—Richard Hjerpe
*Assistant Examiner*—Jean Lesperance
(74) *Attorney, Agent, or Firm*—Andrew J. Anderson; Thomas H. Close

(57) ABSTRACT

A color OLED display includes an array of light emitting pixels, each pixel having three light emitting elements for emitting red, green, and blue colors of light specifying a gamut and at least one additional element for emitting a color of light within the gamut and wherein the power efficiency of the additional element is higher than the power efficiency of at least one of the red, green, and blue elements; and wherein the light emitting elements in the pixel are arranged in a two-by-two array having the green light emitting element and the additional element diagonally opposed to each other at two opposite corners of the two-by-two array and having the red and blue light emitting elements diagonally opposed to each other at the other two opposite corners of the two-by-two array, and wherein the additional element is larger than at least one of the red, green or blue light emitting elements.

13 Claims, 2 Drawing Sheets

COLOR OLED DISPLAY WITH IMPROVED POWER EFFICIENCY

FIELD OF THE INVENTION

The present invention relates to OLED color displays and, more particularly, to arrangements of light emitting elements in such OLED color displays.

BACKGROUND OF THE INVENTION

U.S. Patent Application Publication 2002/0186214A1, by Siwinski, published Dec. 12, 2002, shows a method for saving power in an organic light emitting diode (OLED) display having pixels comprised of red, green, blue and white light emitting elements. The white light emitting elements are more efficient than the other colored light emitting elements and are employed to reduce the power requirements of the display. In a power saving mode, only the white emitting elements are employed to display a black and white image that uses less power. The white emitting elements are not used in the full color display mode.

While power efficiency is always desirable, it is particularly desirable in portable applications because an inefficient display limits the time the device can be used before the power source is recharged. In fact, for certain applications the rate of power consumption may be more important than any other display characteristic with the exception of visibility.

It is also known to provide an OLED display having pixels with differently sized red, green and blue light emitting elements, wherein the relative sizes of the elements in a pixel are selected to extend the service life of the display. See U.S. Pat. No. 6,366,025 B1, issued Apr. 2, 2002 to Yamada.

It has been known for many years that the human eye is most sensitive to green light and less sensitive to red and blue light. More specifically, the spatial resolution of the human visual system is driven primarily by the luminance rather than the chrominance of a signal. Since green light provides the preponderance of luminance information in typical viewing environments, the spatial resolution of the visual system during normal daylight viewing conditions is highest for green light, lower for red light, and even lower for blue light when viewing images generated by a typical color balanced image capture and display system. This fact has been used in a variety of ways to optimize the frequency response of imaging systems. For example, as described in U.S. Patent Application Publication 2002/0024618 A1, by Imai, published Feb. 28, 2002, in a pixel having a square array of red, green, blue and white light emitting elements, the colors green and white having large luminance components are positioned diagonally opposite. However, this design does not provide increased power efficiency for an emissive full-color display.

There is a need, therefore, for an improved OLED display having improved power efficiency, resolution, and extended lifetime.

SUMMARY OF THE INVENTION

The need is met according to the present invention by providing a color OLED display that includes an array of light emitting pixels, each pixel having three light emitting elements for emitting red, green, and blue colors of light specifying a gamut and at least one additional element for emitting a color of light within the gamut and wherein the power efficiency of the additional element is higher than the power efficiency of at least one of the red, green, and blue elements; and wherein the light emitting elements in the pixel are arranged in a two-by-two array having the green light emitting element and the additional element diagonally opposed to each other at two opposite corners of the two-by-two array and having the red and blue light emitting elements diagonally opposed to each other at the other two opposite corners of the two-by-two array, and wherein the additional element is larger than at least one of the red, green or blue light emitting elements.

ADVANTAGES

The advantages of this invention are a color display device with improved power efficiency, resolution and extended lifetime.

DETAILED DESCRIPTION OF THE INVENTION

Figure 1:
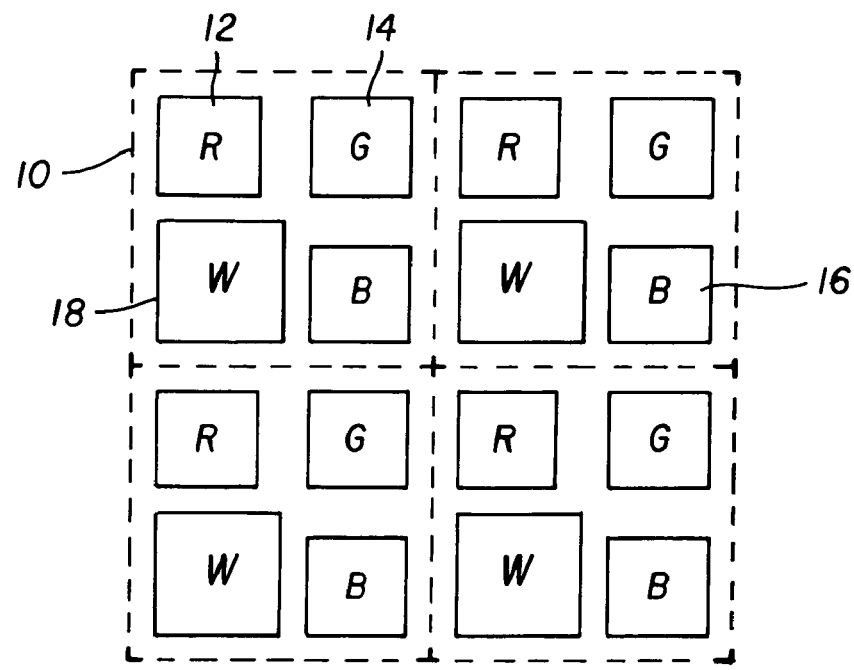
FIG. 1 is a schematic diagram showing the relative sizes and arrangements of light emitting elements in a pixel of a display according to one embodiment of the present invention.

Referring to FIG. 1, an OLED display panel (a small portion of which is shown) according to the present invention includes an array of pixels 10; each pixel 10 is composed of a red 12, a green 14, and a blue 16 light emitting element that define the gamut of the display and an additional element 18 that emits light having a color within the gamut (e.g. white light). The light emitting elements in the pixel 10 are arranged in a two-by-two array having the green light emitting element 14 and the additional element 18 diagonally opposed to each other at the opposite corner of the two-by-two array and having the red and blue light emitting elements 12 and 16 diagonally opposed to each other at the other two opposite corners of the two-by-two array. It is to be understood that rotations and reflections of this arrangement are considered to be within the scope of the present invention.

Figure 3:
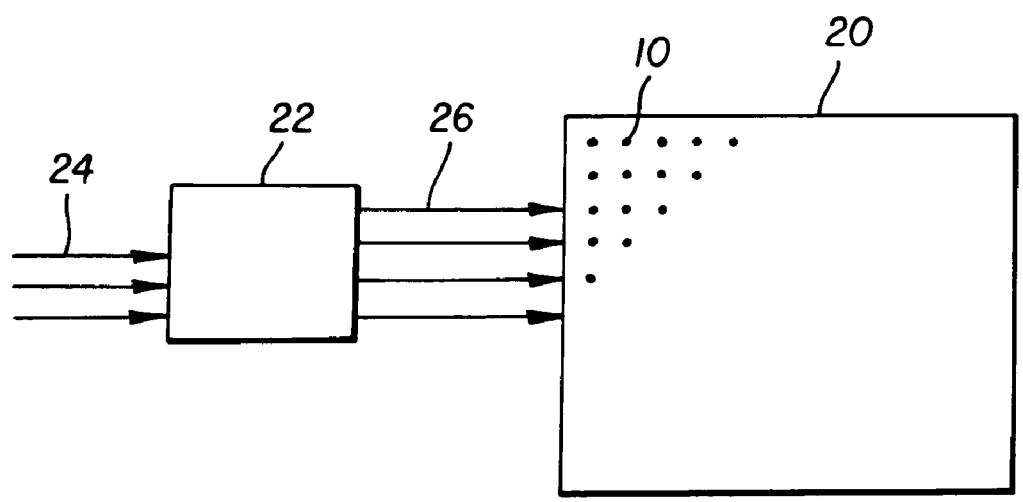
FIG. 3 is a schematic diagram showing a display according to the present invention including signal converter for converting a standard color image to a power saving image signal.

Referring to FIG. 3, the color OLED display includes a display panel 20 having pixels 10 and a signal converter 22. The signal converter 22 converts a standard color image signal 24 to a power saving color image signal 26 suitable for driving the display panel 20, and can include a general purpose microprocessor or special purpose digital signal processing circuits as is known in the art.

The additional element 18 is constructed to have a power efficiency that is higher than the power efficiency of at least one of the red, green, and blue elements 12, 14 and 16. Also, the additional element 18 is larger than at least one of the red, green or blue light emitting elements 12, 14 or 16. The light emitting elements in the pixels are all individually addressable using conventional means. Moreover, because OLED displays utilize separate light emitters for each color element, if the brightness of an element is reduced, the power is likewise reduced.

According to the present invention, the additional in-gamut element provides a greater luminance contribution than either the red or blue elements. It is well known that the green element also provides a greater luminance contribution than either the red or blue elements. Hence, by positioning the additional element and the green element in a spatially uniform way within a pixel and at opposite corners of the two-by-two array, the luminance signal is provided at a higher resolution than would otherwise be the case. This enhances the resolution of the display and improves the quality of images displayed thereon.

Moreover, according to the present invention, luminance that would conventionally be produced by a combination of lower power efficiency gamut elements can instead be produced by the higher power efficiency additional elements. Thus, any color that can be reproduced using the additional elements will be more efficient than an equivalent reproduction using the gamut elements. A suitable transformation function may be provided by a signal processor that converts a standard color image signal to a power saving image signal that is employed to drive the display of the present invention.

The present invention can be employed in most OLED device configurations that include four OLEDs per pixel. These include very unsophisticated structures comprising a separate anode and cathode per OLED to more sophisticated devices, such as passive matrix displays having orthogonal arrays of anodes and cathodes to form pixels, and active-matrix displays where each pixel is controlled independently, for example, with a thin film transistor (TFT). The present invention can be employed in either a top or bottom emitting OLED device of the types known in the prior art.

The display is capable of presenting all of the colors presented by a standard three color, red, green, and blue OLED display device. The color of the additional element 18 may be designed to match the white point of the display. In this embodiment, a controller used to drive the display is configured to allow any gray value, including white, which would typically be presented using a combination of the red 12, green 14, and blue 16 color OLEDs to be created using primarily the additional OLED 18. To achieve this, the peak luminance of the additional OLED 18 is designed to match the combined luminance of the red 12, green 14, and blue 16 OLEDs. That is, in a typical configuration where the prior art display would be designed to achieve a peak luminance of 100 cd/sq. m, the red 12, green 14, and blue 16 OLEDs will be set up to produce this peak luminance when they are all turned on to their maximum value and the additional OLED 18 will also be designed to provide this same peak luminance.

It should be noted however, that under certain circumstances it may be desirable to design the color of the additional element 18 to provide a color point other than the display white point inside the gamut defined by the red, green, and blue elements. For example by biasing the color of the additional or "white" element 18 towards the color of one of the gamut elements, the designer reduces the reliance of the display on gamut element toward which the additional element is biased.

It may also be desirable to set the peak luminance of the additional element 18 to other luminance values, including lower values, such as half the luminance of the peak luminance of the combined gamut elements which increases the reliance on the gamut elements while reducing the reliance on the additional element. The peak luminance of the additional element may also be designed to higher values, such as one and a half times the peak luminance of the combined gamut elements. However, this bias can result in loss of saturation for colors that are high in luminance that should be rendered as high in saturation.

Once the display is designed to provide the correct luminance value for each light emitting element, a suitable method is employed to map from a conventional three-channel data signal to a four-channel signal, for example using a suitable look-up table or matrix transform as is known in the art. Alternatively, the conversion may be accomplished real time using an algorithm that specifies the conversion. The signal conversion is implemented in the signal converter 22.

It should be noted, that the signal conversion described above does not consider the spatial layout of the OLEDs within the display device. However, it is known that traditional input signals assume that all of the OLEDs used to compose a pixel are located in the same spatial location. Visually apparent artifacts that are produced as a result of having the different colored OLEDs at different spatial locations are often compensated through the use of spatial interpolation algorithms, such as the one discussed by Klompenhouwer et al. entitled "Subpixel Image Scaling for Color Matrix Displays". These algorithms will, depending upon the spatial content of the image, adjust the drive signal for each OLED to reduce the visibility of spatial artifacts and improve the image quality of the display, particularly near the edges of objects within the image and will be applied in conjunction with or after the before mentioned signal conversion is applied. It should be noted that the image quality improvement that is obtained near the edges of objects within the image is derived from increased sharpness of edges, decreases in the visibility of color fringing and improved edge smoothness. The spatial interpolation algorithm may be implemented in the signal converter 22.

Because the transform from three to four colors is non-deterministic (i.e. many colors in the conventional specification can be created with either combinations of the gamut elements alone or in one of many combinations with the additional element), different conversions are possible. However, by selecting the peak luminance of the additional element to match the combined peak luminances of the gamut defining elements, it is possible to perform the conversion to allow the additional element to provide as much luminance to each color as possible while maintaining saturation of all colors. This approach provides the maximum power savings possible with the present invention.

The different colored light emitting elements may be provided by a uniform white light emitting layer of OLED material to provide an array of white light emitting elements and an array of color filters overlaying the white light emitting elements to provide the colored light emitting elements of the present invention. In this implementation, the efficiency of the additional element will be higher than that of the gamut defining elements if no filter, or a broad spectrum filter is provided over the additional element. Although a single OLED material is used, variations in element use can cause variations in element aging.

Alternatively several different OLED materials that are doped to provide multiple colors may be used to construct the differently colored light emitting elements. For example, the red 12, green 14, blue 16 and white 18 OLEDs may be composed of different OLED materials that are doped to produce different colored OLEDs. In this alternative implementation, OLEDs formed from materials that are doped to produce different colors may have significantly different luminance efficiencies and therefore it may be desirable to select a white OLED with chromaticity coordinates that are biased towards the chromaticity coordinate of the OLED with the lowest power efficiency. By selecting the chromaticity coordinate of the white OLED in this way, the element with the lowest power efficiency is replaced more often by the white OLED, decreasing the overall power usage. In this alternative implementation, the various OLED materials will age at different rates depending on the material characteristics and usage.

Further, for the implementations described above, the different OLED elements may need to be driven at different levels to produce a color-balanced display. It is important to realize that the stability of OLED materials is inversely related to the current density that is used to drive the OLED. The lifetime of an OLED is influenced by the current density that is used to drive the OLED, therefore, the need to drive some elements with a higher current density may shorten the life of the OLEDs of the given color. Further, OLED materials that are doped to produce different colors typically have different luminance stabilities. That is, the change in luminance output that occurs over time is different for the different materials.

In the embodiments that have been discussed above, it is important to note that because the additional element is significantly more efficient than at least one of the gamut elements, the current density or power required to drive the additional element is significantly lower than for the at least one gamut element(s). It is also important to note that the luminance stability over time of the materials used to create the light emitting elements is typically related to the current density used to drive the elements through a very non-linear function in which the luminance stability over time of the material is much poorer when driven to higher current densities. In fact, the function used to describe this relationship can typically be described as a power function. For this reason, it is not desirable to drive any elements to current densities that are higher than a given threshold where the function describing the luminance stability over time is particularly steep. At the same time, it may be desirable to achieve maximum display luminance values that would typically require the gamut elements to be driven to this current density.

To optimize a display device for various applications, differently sized elements are used. Studies conducted by the present Inventors have shown that saturated colors occur less frequently than unsaturated colors in both natural and computer generated images and graphics. Hence the efficiency of a display can be improved by using the additional element in the place of the gamut defining elements. Moreover, the use of the additional element can be so high in typical applications that in order to reduce the current density in the additional element, it is useful to increase the size of the additional element. Typical OLED materials presently in use have a relatively higher efficiency for the additional element and the green element, and a relatively lower efficiency for the red and blue elements. Therefore, an optimized display according to the present invention may have relatively larger red, blue and additional elements, and relatively smaller green elements. For example, in applications for which black-and-white use dominates, the additional white OLED elements will be used more heavily than any of the gamut defining elements and may therefore be increased in size to reduce the current density and hence aging of the additional element. Text and graphic based applications are typically of this type.

Figure 2:
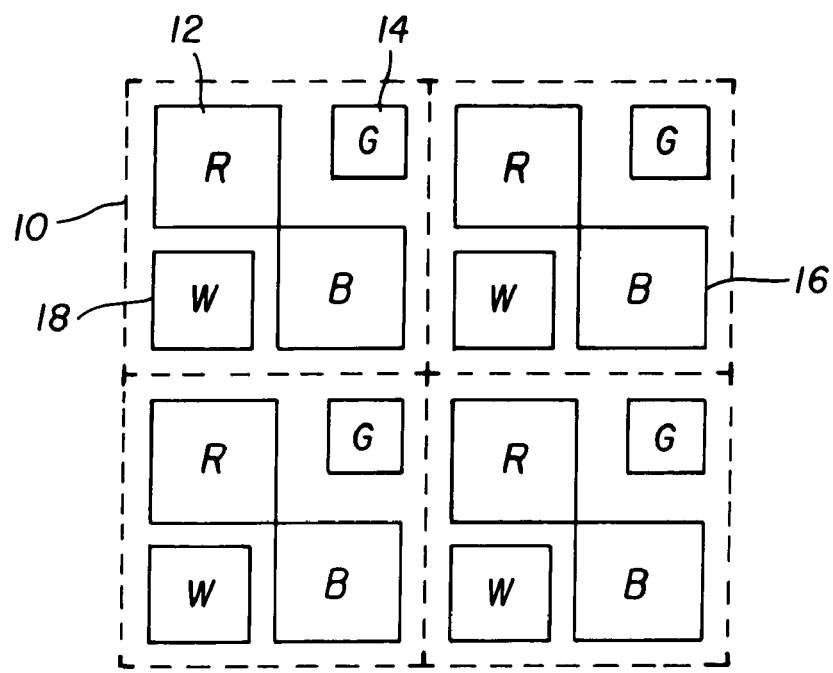
FIG. 2 is a schematic diagram showing the relative sizes and arrangements of light emitting elements in a pixel of a display according to an alternative embodiment of the present invention.
Figure 4:
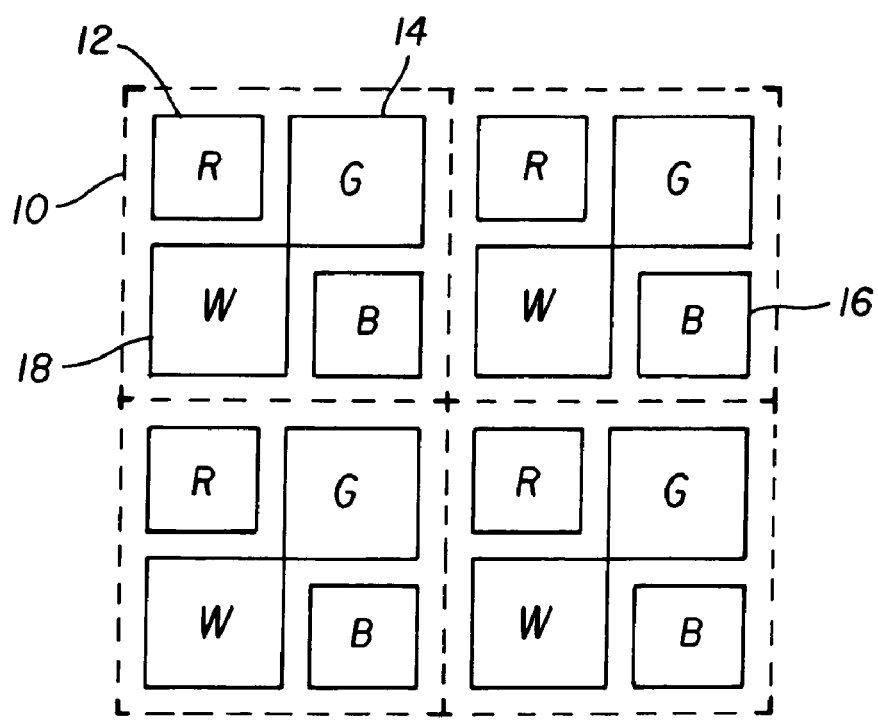
FIG. 4 is a schematic diagram showing the relative sizes and arrangements of light emitting elements in a pixel of a display according to an alternative embodiment of the present invention.

An example of this arrangement described above is shown in FIG. 2, where the green light emitting element 14 is relatively smaller than the additional element 18, and the red and blue elements 12 and 16 are relatively larger than the additional element. The red and blue elements 12 and 16 are largest to compensate for their relatively lower efficiency and the additional element 18 is larger than the green element 14 to accommodate the larger usage of non saturated colors in a typical application. The relative size of the additional element with respect to the red and blue elements may be adjusted to compensate for their relative efficiencies and expected use. For example, as shown in FIG. 4, the green element 14 is larger than the red element 12 or blue elements 16 and is useful with a white light emitter having a relatively higher efficiency emission in red and blue such as that disclosed in EP1286569A1.

The invention has been described in detail with particular reference to certain preferred embodiments thereof, but it will be understood that variations and modifications can be effected within the spirit and scope of the invention.

PARTS LIST 10 pixel
12 red light emitting element
14 green light emitting element
16 blue light emitting element
18 additional (white) light emitting element
20 display panel
22 signal converter
24 standard color image signal
26 power saving color image signal

What is claimed is:

1. A color OLED display, comprising:
    a) an array of light emitting pixels, each pixel having three light emitting elements for emitting red, green, and blue colors of light specifying a gamut and at least one additional element for emitting a color of light within the gamut and wherein the power efficiency of the additional element is higher than the power efficiency of at least one of the red, green, and blue elements; and
    b) wherein the light emitting elements in the pixel are arranged in a two-by-two array having the green light emitting element and the additional element diagonally opposed to each other at two opposite corners of the two-by-two array and having the red and blue light emitting elements diagonally opposed to each other at the other two opposite corners of the two-by-two array, and wherein the additional element is larger than at least one of the red, green or blue light emitting elements.

2. The display device claimed in claim 1, wherein the additional element emits white light.

3. The display claimed in claim 1, wherein the additional element is larger than the green element.

4. The display claimed in claim 3, wherein the red and blue light emitting elements are larger than the green light emitting element.

5. The display claimed in claim 4, wherein the red and blue light emitting elements are larger than the additional light emitting element.

6. The display claimed in claim 1, wherein the additional element is larger than any of the red, green, or blue light emitting elements.

7. The display claimed in claim 1, wherein the display is a top emitting device.

8. The display in claim 1, wherein the display is a bottom emitting device.

9. The display in claim 1, wherein the display is an active matrix device.

10. The display in claim 1, wherein the display is a passive matrix device.

11. The display claimed in claim 1, wherein the light emitted by each of the red, green, or blue elements has a narrower bandwidth than a bandwidth of light emitted by the additional element.

12. The display claimed in claim 11, further comprising means for converting a standard color image signal to power saving image signal for driving the display.

13. The display claimed in claim 12, wherein the means for converting further includes means for spatially interpolating the power saving image signal to improve the spatial resolution of the display.

* * * * *